(12) United States Patent
Kim

(10) Patent No.: US 9,355,715 B1
(45) Date of Patent: May 31, 2016

(54) MEMORY SYSTEM AND METHOD OF OPERATING THE SAME

(71) Applicant: SK hynix Inc., Gyeonggi-do (KR)

(72) Inventor: Young Gyun Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/709,114

(22) Filed: May 11, 2015

(30) Foreign Application Priority Data

Nov. 28, 2014 (KR) .......................... 10-2014-0169049

(51) Int. Cl.
| | |
|---|---|
| *G11C 8/12* | (2006.01) |
| *G11C 11/56* | (2006.01) |
| *G11C 7/10* | (2006.01) |
| *G11C 16/10* | (2006.01) |

(52) U.S. Cl.
CPC ........ *G11C 11/5628* (2013.01); *G11C 11/5642* (2013.01); *G11C 7/1021* (2013.01); *G11C 8/12* (2013.01); *G11C 16/10* (2013.01)

(58) Field of Classification Search
CPC ......... G11C 8/12; G11C 7/1021; G11C 16/10
USPC ................ 365/238.5, 189.15, 185.11, 230.03
See application file for complete search history.

(56) References Cited

U.S. PATENT DOCUMENTS

2007/0268748 A1* 11/2007 Lee .................... G11C 11/5628
365/185.08

FOREIGN PATENT DOCUMENTS

| KR | 1020080053779 | 6/2008 |
|---|---|---|
| KR | 1020100004731 | 1/2010 |

* cited by examiner

*Primary Examiner* — Jason Lappas
(74) *Attorney, Agent, or Firm* — IP & T Group LLP

(57) ABSTRACT

A memory system and a method of operating the same are provided. The method includes reading least significant bit (LSB) data of a first physical page based on a first pre-read voltage and performing a most significant bit (MSB) program based on the LSB data of the first physical page when the MSB program is performed on the first physical page, defining a management area by comparing the number of error bits included in MSB data of the first physical page with a first threshold value, preforming an LSB program on a second physical page of the management area, reading LSB data of the second physical page based on a second pre-read voltage, which is lower than the first pre-read voltage, and performing the MSB program on the second physical page based on the LSB data of the second physical page.

20 Claims, 13 Drawing Sheets

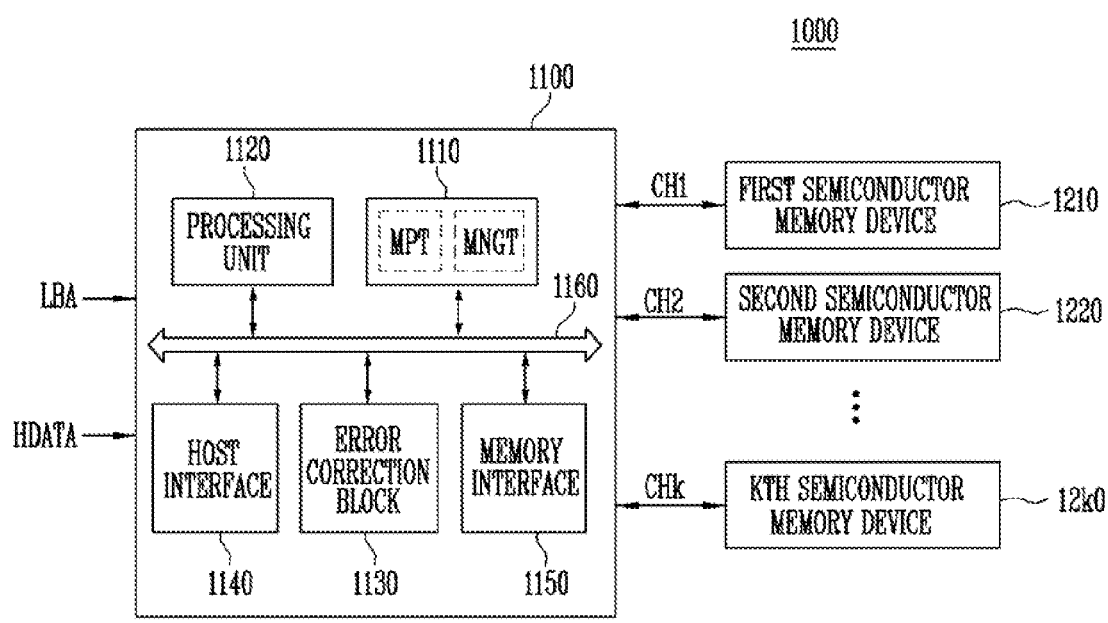

MEMORY SYSTEM AND METHOD OF OPERATING THE SAME

CROSS-REFERENCE TO RELATED APPLICATION

The present application claims priority to Korean patent application number 10-2014-0169049, filed on Nov. 28, 2014, the entire disclosure of which is herein incorporated by reference in its entirety.

BACKGROUND

1. Field of Invention

The present invention relates to an electronic device, and more particularly, to a memory system and a method of operating the same.

2. Discussion of Related Art

Semiconductor memory devices are implemented with semiconductor materials such as silicon (Si), germanium (Ge), gallium arsenide (GaAs), indium phosphide (InP), etc. The semiconductor memory devices are classified into volatile memory devices and nonvolatile memory devices.

The volatile memory devices lose stored data when their power supplies are interrupted. Volatile memory devices include static random access memory (SRAM), dynamic RAM (DRAM), synchronous DRAM (SDRAM), etc. Nonvolatile memory devices retain stored data even when their power supplies are interrupted. Nonvolatile memory devices include read only memory (ROM), programmable ROM (PROM), erasable programmable ROM (EPROM), electrically erasable programmable ROM (EEPROM), flash memory, phase-change RAM (PRAM), magnetic RAM (MRAM), resistive RAM (RRAM), ferroelectric RAM (FRAM) etc. Flash memories are classified into NOR and NAND types.

SUMMARY

Various embodiments are directed to a memory system capable of improving reliability, and a method of operating the same.

One aspect of the present invention provides a method of operating a memory system including reading least significant bit (LSB) data of a first physical page based on a first pre-read voltage and performing a most significant bit (MSB) program based on the LSB data of the first physical page when the MSB program is performed on the first physical page, defining an area corresponding to the first physical page as a management area by comparing the number of error bits included in MSB data of the first physical page with a first threshold value, preforming an LSB program on a second physical page of the management area, reading LSB data of the second physical page based on a second pre-read voltage lower than the first pre-read voltage and performing the MSB program on the second physical page based on the LSB data of the second physical page.

As an embodiment, the area corresponding to the first physical page is, defined as the management area when the number of the error bits included in the MSB data of the first physical page is greater than the first threshold value.

As an embodiment, the defining of the area corresponding to the first physical page as the management area may include reading the MSB data of the first physical page, detecting the number of the error bits included in the MSB data of the first physical page, and defining the area corresponding to the first physical page as the management area when the number of the error bits induced in the MSB data of the first physical page is greater than the first threshold value.

As an embodiment, the area corresponding to the first physical page is defined as the management area when the number of the error bits included in the MSB data of the first physical page is greater than the first threshold value and the number of error bits included in the LSB data of the first physical page is less than or equal to a second threshold value.

As an embodiment, the defining of the area corresponding to the first physical page as the management area may include reading the LSB data of the first physical page, detecting the number of the error bits included in the LSB data of the first physical page, reading the MSB data of the first physical page, detecting the number of the error bits included in the MSB data of the first physical page, and defining the area corresponding to the first physical page as the management area when the number of the error bits included in the MSB data of the first physical page is greater than the first threshold value and the number of the error bits included in the LSB data of the first physical page is less than or equal to the second threshold value.

As an embodiment, the first physical page may be defined as the management area when the number of the error bits included in the MSB data of the first physical page is greater than the first threshold value. A memory block including the first physical page may be defined as the management area when the number of the error bits included in the MSB data of the first physical page is greater than the first threshold value. A semiconductor memory device including the first physical page may be defined as the management area when the number of the error bits included in the MSB data of the first physical page is greater than the first threshold value.

As an embodiment, the first physical page may be the same as the second physical page. Alternatively, the first physical page may be different from the second physical page.

As an embodiment, the method may further include performing the LSB program on the first physical page before performing the MSB program based on the LSB data of the first physical page.

As an embodiment, the reading of the LSB data of the second physical page may include setting a voltage generator included in the memory system to generate the second pre-read voltage and reading the LSB data of the second physical page based on the second pre-read voltage provided by the voltage generator.

As an embodiment, the defining of the area corresponding to the first physical page as the management area may be performed each given time.

As an embodiment, the defining of the area corresponding to the first physical page as the management area may be performed each time at which a predetermined number of program and erase operations are performed.

Another aspect of the present invention provides a memory system including a semiconductor memory device having a plurality of physical pages, suitable for reading LSB data of each physical page based on a first pre-read voltage and performing an MSB program based on the LSB data when the MSB program is performed on each of the plurality of physical pages, and a memory controller suitable for comparing the number of error bits included in MSB data of each physical page with a first threshold value to define an area of a corresponding physical page as a management area according to a result of the comparing. The memory controller controls the semiconductor memory device to read LSB data of a physical page included in the management area based on a second pre-read voltage that is lower than the first pre-read voltage when the MSB program is performed on the physical page included in the management area.

As an embodiment, under the control of the memory controller, the semiconductor memory device may read the LSB data of the physical page included in the management area based on the second pre-read voltage and perform the MSB program on the physical page included in the management area based on the LSB data.

As an embodiment, the semiconductor memory device may further include a voltage generator suitable for generating a plurality of voltages, and the voltage generator may output the first pre-read voltage among the plurality of voltages, and may output the second pre read voltage among the plurality of voltages under the control of the memory controller when the MSB program is performed on the physical page included in the management area.

As an embodiment, when a physical page that stores the MSB data having the number of error bits greater than the first threshold value is detected, the memory controller may define an area corresponding to the detected physical page as the management area.

As an embodiment, when a physical page, which stores the MSB data having the number of the error bits greater than the first threshold value and the LSB data having the number of error bits less than or equal to the second threshold value, is detected, the memory controller may define an area corresponding to the detected physical page as the management area.

As an embodiment, the memory controller may store a table for representing the management area therein.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 13 is a block diagram showing a memory system according to an embodiment of the present invention;

FIG. 14 is a view showing a management area table stared in a RAM;

DETAILED DESCRIPTION

Hereinafter, exemplary embodiments of the invention will be described in detail with reference to the accompanying drawings. The following descriptions will be made focusing on configurations necessary for understanding operations according to the embodiments of the invention. Therefore, descriptions of other configurations that are well known in the art and may distract from the focus of the invention will be omitted. Further, these inventive concepts may be embodied in different forms and should not be construed as limited to the embodiments set forth herein. These embodiments are described in detail so that the inventive concepts may be easily applied by those who are skilled in the art.

Throughout this specification, when an element is referred to as being "connected" to another element, that element can be "directly connected" to the other element or "indirectly connected" to the other element with other intervening element(s). Throughout this specification, when a certain part "includes" a certain component, it means that another component may be further included, unless otherwise stated.

Figure 1:
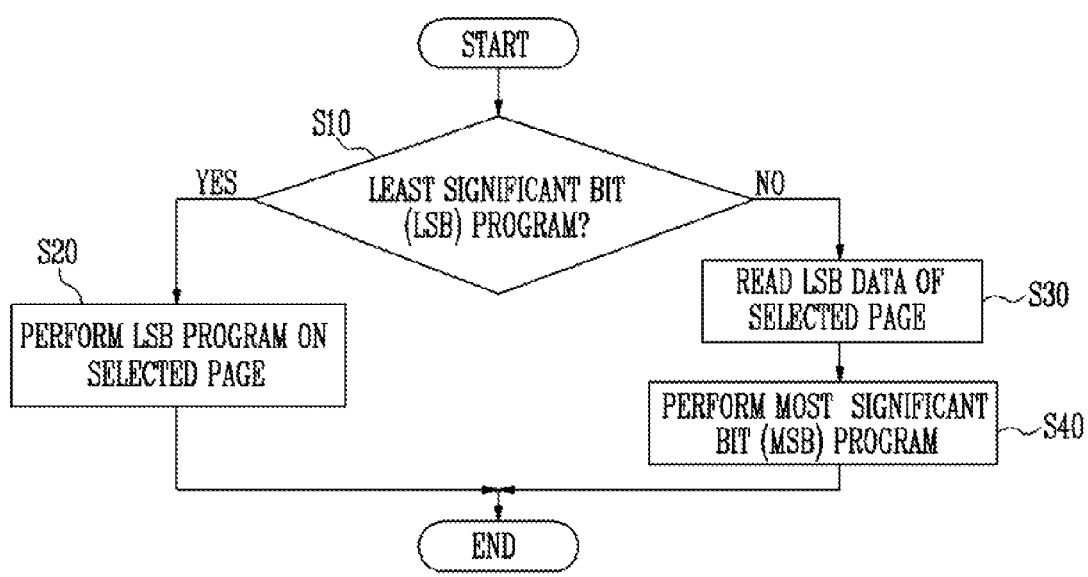
FIG. 1 is a flowchart showing a method of programming a semiconductor memory device according to an embodiment of the present invention.

FIG. 1 is a flowchart showing a method of programming a semiconductor memory device according to an embodiment of the present invention. Hereinafter, it Is assumed that each memory cell included in the semiconductor memory device stores multiple bit data. That is, it is assumed that each memory cell included in the semiconductor memory device is a multi-level cell (MLC).

Referring to FIG. 1, the semiconductor memory device determines whether a program to be performed is a least significant bit (LSB) program at step S10. When the LSB program is completed on a selected physical page, the selected physical page stores LSB data. When a most significant bit (MSB) program is completed on the selected physical page, the selected physical page stores the LSB data and MSB data. In this case, the LSB data of the selected physical page include an LSB of each memory cell of the selected physical page and the MSB data of the selected physical page include an MSB of each memory cell of the selected physical page.

When it is determined that the program to be performed is the LSB program (YES), the semiconductor memory device performs the LSB program on the selected memory cells at step S20. On the other hand, when it is determined that the program to be performed is the MSB program (NO), the semiconductor memory device reads the LSB data of the selected memory cells at step S30 to perform the MSB program based on the LSB data at step S40.

Figure 2:
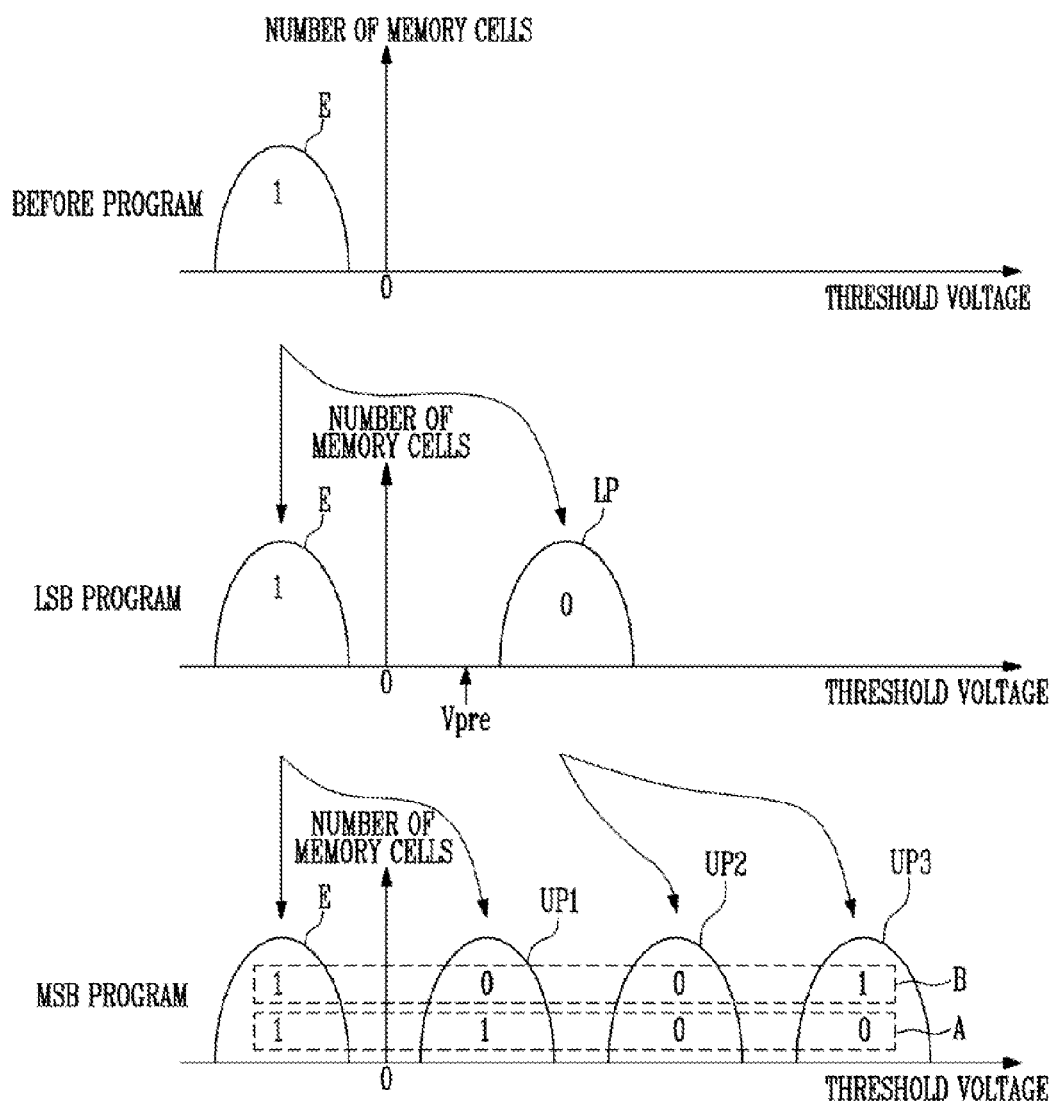
FIG. 2 is a graph showing a threshold voltage distribution of memory cells which are programmed according to the programming method of FIG. 1.

FIG. 2 is a graph showing a threshold voltage distribution of memory cells which are programmed according to the programming method of FIG. 1.

Referring to FIG. 2, a horizontal axis represents a threshold voltage and a vertical axis represents the number of memory cells. A logical value of the memory cell is determined according to the threshold voltage. It is assumed that the memory cells each store two-bit data.

For example, when the semiconductor memory device is a flash memory, a read or program operation of the semiconductor memory device is performed in units of physical pages. However, the semiconductor memory device according to the embodiment of the present invention will not be limited to the flash memory. For example, the semiconductor memory device according to an embodiment of the present invention may include a memory such as an erasable programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), etc.

Before the program operation is performed, the memory cells sharing one word line, i.e., corresponding to one physical page, have an erase state E. For example, a voltage range corresponding to the erase state E may be lower than a ground voltage. For example, it may be defined that the memory cells of the erase state E each store a logical value "1."

When the LSB program is performed, the memory cells of the erase state E are programmed to have the erase state E or a lower program state LP. According to data to be programmed, the memory cells of the erase state E are programmed to have the erase state E or the lower program state LP. For example, it may be defined that the memory cells of the erase state E store the logical value "1" and the memory cells of the lower program state LP store a logical value "0." That is, the LSB data are stored in the corresponding physical page by the LSB program and the LSB data form one logical page.

When the MSB program is performed, the memory cells are programmed to have one of the erase state E, and first to third program states UP1 to UP3. According to the data to be programmed, the memory cells of the erase state E are programmed to have the erase state E or the first program state UP1, and the memory cells of the lower program state LP are programmed to have the second upper program state UP2 or the third upper program state UP3. To this end, the LSB data stored in the memory cells are read based on a pre-read voltage Vpre. The logical value of each memory cell is determined based on whether the threshold voltage of each memory cell is greater than the pre-read voltage Vpre or less than or equal to the pre-read voltage Vpre. Then, with reference to the determined logical value, the threshold voltage of each memory cell s changed according to MSB data to be programmed.

For example, the erase state E may correspond to data "11," the first upper program state UP1 may correspond to data "01," the second upper program state UP2 may correspond to data "00," and the third upper program state UP3 may correspond to data "10." That is, the MSB data are stored in the corresponding physical page by the MSB program and the MSB data form one logical page. That is, one logical page is added to the corresponding physical page. For example, the LSB's A of the erase state E and the first to third upper program states UP1 to UP3 may be defined as "1," "1," "0," and "0," respectively, and the MSB's B of the erase state E and the first to third upper program states UP1 to UP3 may be defined as "1," "1," "0," and "1," respectively.

Figure 3:
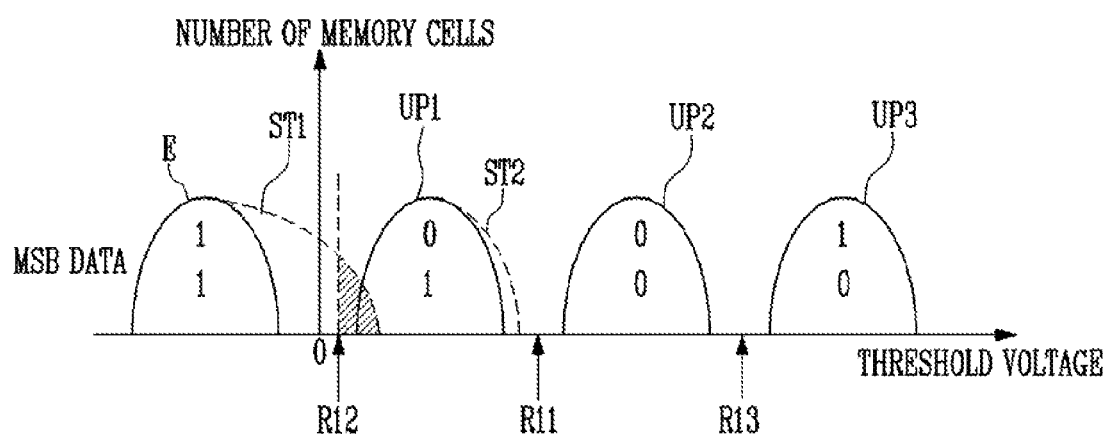
FIG. 3 is a graph showing a threshold voltage distribution which is changed after a most significant bit (MSB) program is performed.

FIG. 3 is a graph showing a threshold voltage distribution, which is changed after the MSB program, is performed.

Referring to FIG. 3, when the LSB data stored in the memory cells are read during the MSB program, a first read voltage R11 is applied to the word line of the selected physical page. The memory cells having the threshold voltage lower than the first read voltage R11, that is, the memory cells corresponding to the erase state E and the first upper program state UP1, are determined as the logical value "1." The memory cells having the threshold voltage higher than the first read voltage R11, that is, the memory cells corresponding to the second and third upper program states UP2 and UP3, are determined as the logical value "0."

When the MSB data are read, a second read voltage R12 is applied to the word line of the selected physical page. The second read voltage R12 is a voltage between the erase state E and the first upper program state UP1. The memory cells corresponding to the erase state E are read as a first logical value. The memory cells of the first to third upper program states UP1 to UP3 have a second logical value. That is, the memory cells corresponding to the erase state E may be determined. Thereafter, a third read voltage R13 is applied to the word line of the selected physical page. The third read voltage R13 is a voltage between the second and third upper program states UP2 and UP3. The memory cells of the erase state E, the first upper program state UP1, and the second upper program state UP2 are read as the first logical value. The memory cells of the third upper program state UP3 are read as the second logical value. That is, the memory cells corresponding to the third upper program state UP3 may be determined. Then, the MSB data of each memory cell of the selected physical page are determined. It is determined that the memory cells, i.e., the memory cells of the first and second upper program states UP1 and UP2, which are read as the second logical value based on the second read voltage R12 and read as the first logical value based on the third read voltage R13, store the logical value "0." It is determined that the other memory cells, i.e., the memory cells of the erase state E and the third upper program state UP3, store the logical value "1."

Each of the first to third read voltages R11, R12, and R13 may be an optimized voltage considering read margins between the erase state E and the first to third upper program states UP1 to UP3.

Meanwhile, the threshold voltage distribution of each logical state may be changed into a threshold voltage distribution wider than that of a target window due to various causes. For example, the threshold voltage of each logical state may be increased due to coupling between adjacent memory cells. The coupling is referred to as "electric field coupling" or "F-poly coupling." For example, the threshold voltage of each logical state may be increased due to high voltages applied when a subsequent program operation is performed on the other physical page.

The memory cells of the erase state E may have a first voltage state ST1 due to the increase in the threshold voltages. The memory cells having the first upper program state UP1 have a second voltage state ST2 due to the increase in the threshold voltages.

Since differences between the threshold voltages of the memory cells corresponding to the erase state E and the threshold voltages of the memory cells corresponding to the second and third upper program states UP2 and UP3 are relatively large, the threshold voltages of the memory cells corresponding to the erase state E may be increased more. For example, when the memory cells corresponding to the erase state E are adjacent to the memory cells corresponding to the second and third upper program states UP2 and UP3, the threshold voltages of the memory cells corresponding to the erase state E may increase greatly. As another example, since differences between the threshold voltage of the erase state E and the high voltages applied when the subsequent program operation is performed on the other physical page are relatively large, the threshold voltage of the memory cell corresponding to the erase state E may be increased greatly. The threshold voltage of the erase state E is easily increased as the program operations and the erase operation are repeatedly performed on the corresponding memory cells.

Since differences between the threshold voltages of the memory cells corresponding to the first upper program state UP1 and the threshold voltages of the memory cells corresponding to the second and third upper program states UP2 and UP3 are less than those of the erase state E, the threshold voltages of the memory cells corresponding to the first upper program state UP1 may be increased less.

Since the second and third upper program states UP2 and UP3 correspond to relatively high threshold voltages, the threshold voltages of the corresponding memory cells may not be easily increased. In FIG. 3, it is shown that the threshold voltages of the second and third upper program states UP2 and UP3 may not be increased.

When the memory cells programmed in the erase state E have the first voltage state ST1, it is assumed that the second read voltage R12 is applied to read the MSB data. When the MSB data are read based on the second read voltage R12, although some MSB data (see a shaded part) of the memory cells of the first voltage state ST1 should be read as the first logical value, they are read as the second logical value. That is, some MSB data of the memory cells programmed as the erase state E are read as a wrong value. The MSB data include more error bits as the number of memory cells programmed in the erase state E is increased. The MSB data include more error bits as the threshold voltages of the erase state E are increased more.

When the memory cells programmed as the first upper program state UP1 have the second voltage state ST2, it is assumed that the first read voltage R11 is applied to read the LSB data. In FIG. 3, since the threshold voltages of the second voltage state ST2 are lower than the first read voltage R11 the memory cells programmed as the first upper program state UP1 are read as the first logical value. Since the threshold voltages of the first upper program state UP1 are increased relatively less than those of the erase state E, the error bits are less likely to be included in the LSB data.

Figure 4:
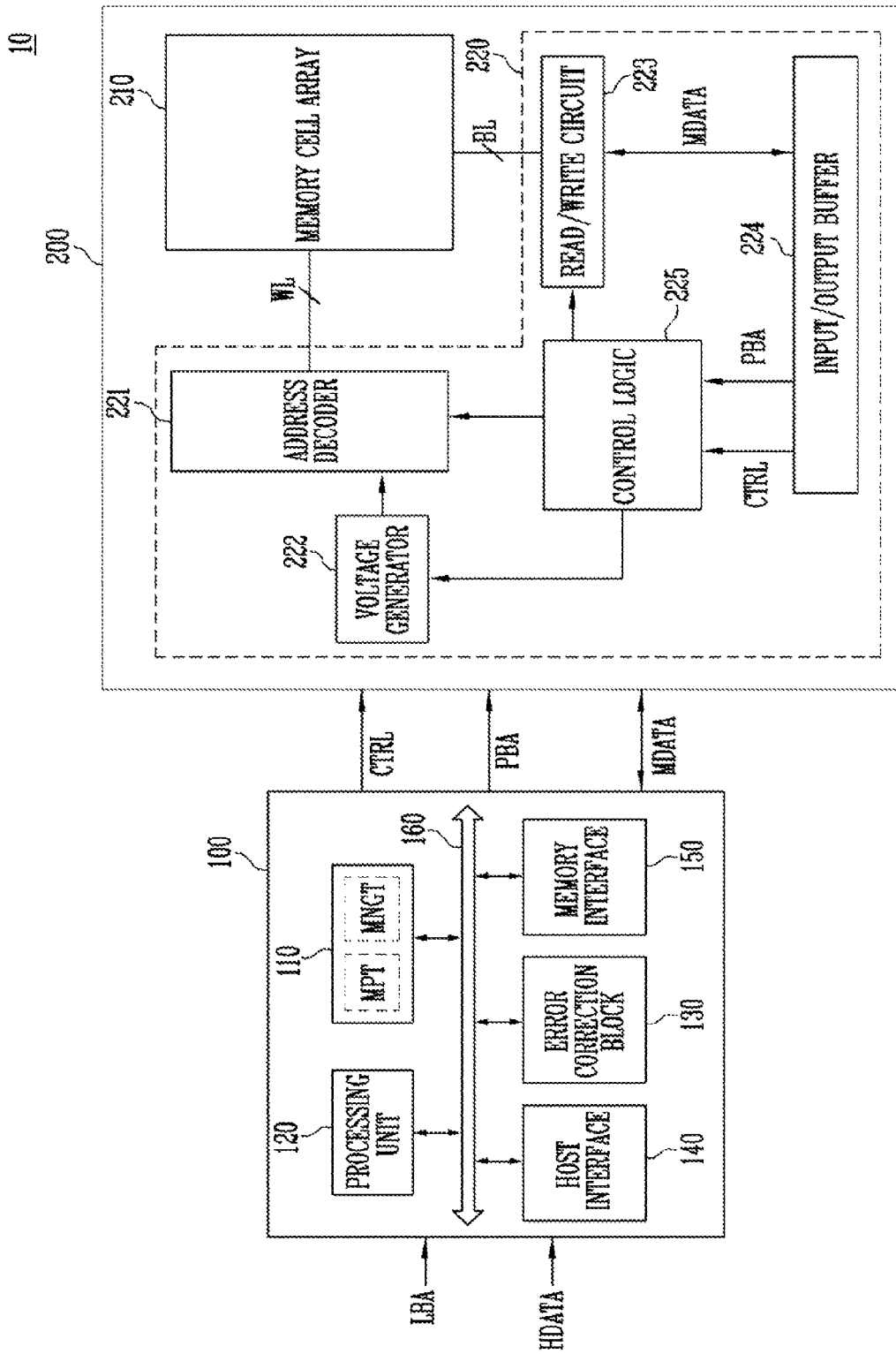
FIG. 4 is a block diagram showing a memory system according to an embodiment of the present invention.

FIG. 4 is a block diagram showing a memory system 10 according to an embodiment of the present invention.

Referring to FIG. 4, the memory system 10 includes a memory controller 100 and a semiconductor memory device 200. The semiconductor memory device 200 may include a nonvolatile memory device.

The memory controller 100 controls overall operations of the semiconductor memory device 200. The memory controller 100 receives an access request from a host (not shown). When a program operation is performed, the access request received from the host includes a logical block address LBA and host data HDATA. When a read operation is performed, the access request received from the host includes the logical block address LBA.

The memory controller 100 is configured to access the semiconductor memory device 200 in response to the access request received from the host. The memory controller 100 is configured to control read, program, erase, and background operations of the semiconductor memory device 200. For example, the memory controller 100 is configured to drive firmware for controlling the semiconductor memory device 200.

When the program operation is performed, the memory controller 100 converts the logical block address LBA into a physical block address PBA, and provides the physical block address PBA, memory data MDATA, and a control signal CTRL for controlling the program operation, to the semiconductor memory device 200.

When the read operation is performed, the memory controller 100 converts the logical block address LBA into the physical block address PBA and provides the physical block address PBA, the memory data MDATA, and the control signal CTRL for controlling the read operation, to the semiconductor memory device 200.

The memory controller 100 includes a RAM 110, a processing unit 120, an error correction block 130, a host interface 140, a memory interface 150, and a bus 160.

The RAM 110 is connected to the bus 160. The RAM 110 operates kinder the control of the processing unit 120. The RAM 110 stores a map table MPT. The map table MPT stores a mapping relationship between the logical block address LBA and the physical block address PBA.

The RAM 110 further stores a management area table MNGT. The management area table MNGT includes information on a management area. The management area may indicate an area having a reliability lower than a target level, in a memory cell array 210.

The management area may be designated in units of memory blocks. For example, at least one of the memory blocks in the memory cell array 210 may be designated as the management area. The management area may be designated in units of physical pages. For example, at least one of the physical pages in each memory block may be designated as the management area.

The RAM 110 may be used as a buffer memory between the semiconductor memory device 200 and the host. For example, when the read operation is performed, the memory data MDATA received from the semiconductor memory device 200 may be temporarily stored in the RAM 110 and transmitted to the host as the host data HDATA. When the program operation is performed, the host data HDATA received from the host may be temporarily stored in the RAM 110 and provided to the semiconductor memory device 200 as the memory data MDATA.

As an embodiment, the RAM 110 may include a static RAM (SRAM), a dynamic RAM (DRAM), a synchronous DRAM (SDRAM), etc. For example, the RAM 110 may be used as operational memory of the processing unit 120.

The processing unit 120 is connected to the RAM 110, the error correction block 130, the host interface 140, and the memory interface 150 through the bus 160. The processing unit 120 controls overall operations of the memory controller 100.

The processing unit 120 manages the map table MPT stored in the RAM 110. As an embodiment, the processing unit 120 serves as a flash translation layer (FTL). The processing unit 120 may update the mapping relationship between the logical block address LBA and the physical block address PBA in the map table MPT. The processing unit 120 may convert the logical block address LBA into the physical block address PBA with reference to the map table MPT.

The processing unit 120 determines whether to regulate the pre-read voltage Vpre (see FIG. 2) of the semiconductor memory device 200 with reference to the management area table MNGT. The processing unit 120 determines whether the physical page, in which the MSB data is to be programmed, corresponds to the management area with reference to the management area table MNGT. If the physical page corresponds to the management area, the processing unit 120 may control the semiconductor memory device 200 to use the reduced pre-read voltage Vpre.

As an embodiment, the processing unit 120 transmits information on a voltage level of the pre-read voltage Vpre (hereinafter, referred to as "voltage level information") to the semiconductor memory device 200 to regulate the pre-read voltage Vpre. The semiconductor memory device 200 receives the voltage level information and resets the voltage level of the pre-read voltage Vpre which is generated when the corresponding program operation is performed. Then, the processing unit 120 transfers the control signal CTRL, the physical block address PBA, and the memory data MDATA for the program operation to the semiconductor memory device 200.

As an embodiment, before the pre-read voltage Vpre is regulated, the voltage level of the pre-read voltage Vpre may be set to a default value. The regulated pre-read voltage Vpre may have a lower level than the default value by a predetermined value.

When power is turned off, the processing unit 120 stores the map table MPT and the management area table MNGT, which are stored in the RAM 110, in the semiconductor memory device 200. For example, the map table MPT and the management area table MNGT may be stored in a predetermined memory block in the memory cell array 210. When power is turned on, the processing unit 120 loads the map table MPT and the management area table MNGT from the semiconductor memory device 200 into the RAM 110.

The error correction block 130 adds parity bits to the host data HDATA received from the host based on an error correcting code to generate the memory data MDATA. When the memory data MDATA are received from the semiconductor memory device 200, the error correction block 130 is configured to detect and correct error bits of the memory data MDATA based on the corresponding parity bits. The corrected data are transmitted to the host as the host data HDATA. As an embodiment, the error correction block 130 may provide information on the number of error bits included in the memory data MDATA to the processing unit 120. In this case, the processing unit 120 detects the management area based on the information on the number of the error bits.

The host interface 140 includes a data exchange protocol between the host and the memory controller 100. The host interface 140 transmits the logical block address LBA and the host data HDATA, which are received from the host, to the processing unit 120 through the bus 160.

As an embodiment, the host interface 140 is configured to communicate with the host through one of various interface protocols such as a Universal Serial Bus (USB) protocol, a multimedia card (MMC) protocol, a peripheral component interconnection (PCI) protocol, a PCI express (PCI-E) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, an integrated drive electronics (IDE) protocol, etc. As an embodiment, the host interface 140 may be configured as a proprietary interface.

The memory interface 150 interfaces with the semiconductor memory device 200. For example, the memory interface 150 includes a NAND interface or a NOR interface.

The bus 160 connects the RAM 110, the processing unit 120, the error correction block 130, the host interface 140, and the memory interface 150.

The semiconductor memory device 200 includes the memory cell array 210 and a peripheral circuit 220.

The semiconductor memory device 200 is configured to store the memory data MDATA in an area corresponding to the physical block address PBA received from the memory controller 100 when a program operation is performed. The semiconductor memory device 200 is configured to output the memory data MDATA from the area corresponding to the physical block address PBA received from the memory controller 100 when a read operation is performed. As an embodiment, the semiconductor memory device 200 includes at least one of an EPROM, an EEPROM, a flash memory, a PRAM, an MRAM, an RRAM, an FRAM, etc.

The memory cell array 210 is connected to an address decoder 221 through word lines WL and to a read/write circuit 223 through bit lines BL. The memory cell array 210 includes the plurality of memory blocks (not shown). Each memory block includes a plurality of memory cells. The memory cells arranged in a row direction are connected to the word lines WL, and the memory cells arranged in a row direction are connected to the bit lines BL. The read and program operations of the semiconductor memory device 200 are performed in units of pages. The erase operation is performed in units of memory blocks.

The memory cells, which share one word line, form one physical page. When each memory cell stores x bits, x being a natural number greater than 2, the corresponding physical page includes x logical pages.

The peripheral circuit 220 includes the address decoder 221, the read/write circuit 223, a voltage generator 222, and a control logic 225.

The address decoder 221 is connected to the memory cell array 210 through the word lines WL. The address decoder 221 is connected to the voltage generator 222. The address decoder 221 operates under the control of the control logic 225.

The address decoder 221 receives the physical block address PBA. The address decoder 221 selects one word line based on the physical block address PBA. When the program operation is performed, the address decoder 221 applies a program voltage to the selected word line. Then, the address decoder 221 applies a pass voltage lower than the program voltage to unselected word lines. When the read operation is performed the address decoder 221 applies a read voltage, e.g., one of the first to third read voltages R11, R12, and R13 of FIG. 3, to the selected word line, and applies a read pass voltage of a high voltage to the unselected word line. When the read operation is performed for the MSB program, the address decoder 221 applies the pre-read voltage Vpre to the selected word line, and applies the read pass voltage of a high voltage to the unselected word line.

The voltage generator 222 operates under the control of the control logic 225. The voltage generator 222 generates an internal power voltage based on an external power voltage supplied to the semiconductor memory device 200. For example, the voltage generator 222 generates the internal power voltage by regulating the external power voltage. The generated internal power voltage is provided to the address decoder 221, the read write circuit 223, the input/output buffer 224, and the control logic 225 to be used as an operational voltage.

The voltage generator 222 generates a plurality of voltages based on at least one of the external power voltage and the internal power. As an embodiment, the voltage generator 222 includes a plurality of pumping capacitors which store the internal power voltage, and selectively activates the plurality of pumping capacitors under the control of the control logic 225 to generate the plurality of voltages. For example, the voltage generator 222 generates and provides the read voltage and the read pass voltage of a high voltage to the address decoder 221 under the control of the control logic 225 when the read operation is performed. For example, the voltage generator 222 generates and provides the program voltage of a high voltage and the pass voltage to the address decoder 221 under the control of the control logic 225 when the program operation is performed. For example, the voltage generator 222 generates and provides the pre-read voltage Vpre and the read pass voltage of a high voltage to the address decoder 221 under the control of the control logic 225 when the read operation is performed for the MSB program.

The voltage generator 222 may be reset to change the voltage level of the pre-read voltage Vpre. The voltage generator 222 may be, reset under the control of the control logic. When the read operation is performed for the MSB program after the voltage generator 222 is reset, the voltage generator 222 generates the pre-read voltage Vpre and the read pass voltage of a high voltage.

The read/write circuit 223 is connected to the memory cell array 210 through the bit lines BL. The read/write circuit 223 operates under the control of the control logic 225. The read/write circuit 223 is configured to exchange the memory data MDATA with the input/output buffer 224.

When the read operation is performed, the read/write circuit 223 reads the memory data MDATA from the memory cell array 210 and outputs the read memory data MDATA to the memory controller 100.

When an LSB program is performed, the read/write circuit 223 receives the memory data MDATA from the memory controller 100 through the input/output buffer 224 and stores the received memory data MDATA in the selected physical page. When an MSB program is performed, the read operation for the MSB program may be performed first. That is, the read/write circuit 223 reads the LSB data stored in the selected physical page, and changes threshold voltages of the selected physical page based on the memory data MDATA with reference to the LSB data.

As an embodiment, the read/write circuit 223 includes components such as a sense amplifier, a write driver, a page buffer, a column select circuit, a data buffer, etc.

The control logic 225 is connected to the address decoder 221, the voltage generator 222, and the read/write circuit 223. The control logic 225 is configured to control overall operations of the semiconductor memory device 200. The control logic 225 is configured to control the address decoder 221, the voltage generator 222, and the read/write circuit 223 in response to the control signal CTRL received from the memory controller 100 through the input/output buffer 224. The control logic 225 provides the physical block address PBA, which is received from the memory controller 100 through the input/output buffer 224, to the address decoder 221.

The control logic 225 resets the voltage generator 222 to change the voltage level of the pre-read voltage Vpre under the control of the memory controller 100. As an embodiment, the control logic 225 may receive the voltage level information from the memory controller 100. The control logic 225 resets the voltage generator 222 to change the voltage level of the pre-read voltage Vpre based on the received voltage level information.

Figure 5:
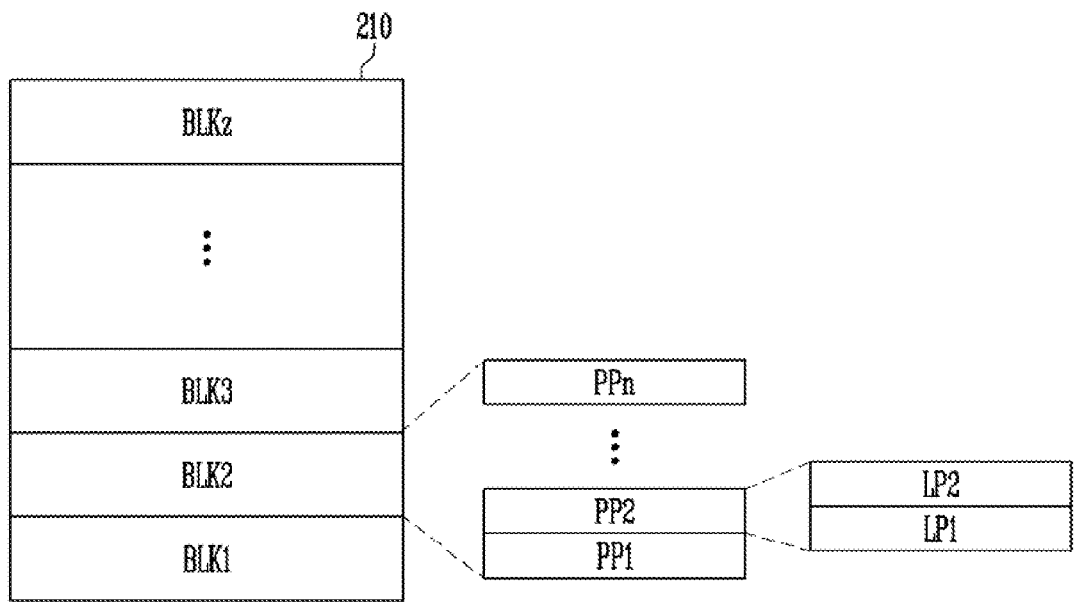
FIG. 5 is a view showing a memory cell array of FIG. 4.

FIG. 5 is a view showing the memory cell array 210 of FIG. 4.

Referring to FIG. 5, the memory cell array 210 includes a plurality of memory blocks BLK1 to BLKz. The plurality of memory blocks each include a plurality of physical pages PP1 to PPn. Each physical page includes the memory cells connected to one word line.

One physical page includes a plurality of logical pages LP1 and LP2. As described with reference to FIG. 2, the memory cells may each store a plurality of bits. When the memory cells each store two-bit data, one physical page includes two logical pages LP1 and LP2. For example, a first logical page LP1 includes the LSB data and the second logical page LP2 includes the MSB data.

Figure 6:
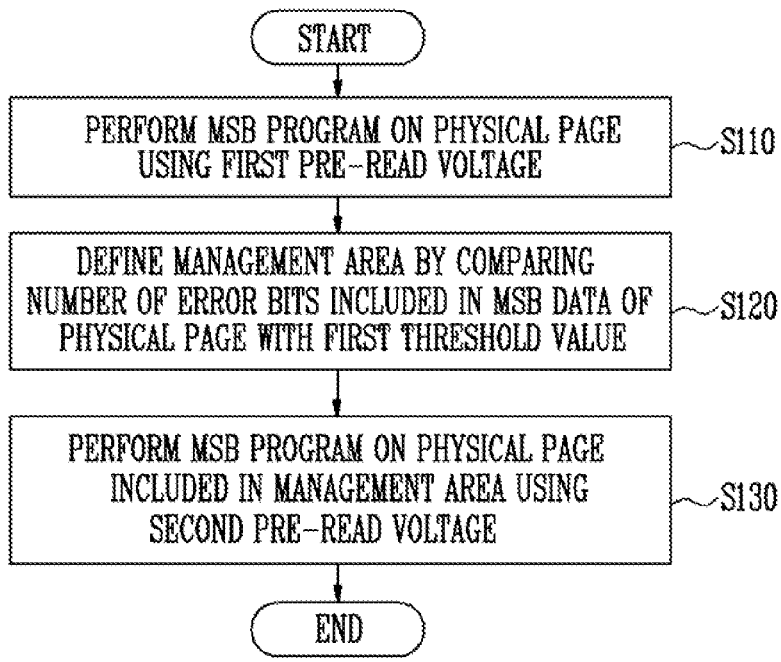
FIG. 6 is a flowchart showing a method of operating memory system according to an embodiment of the present invention.
Figure 7:
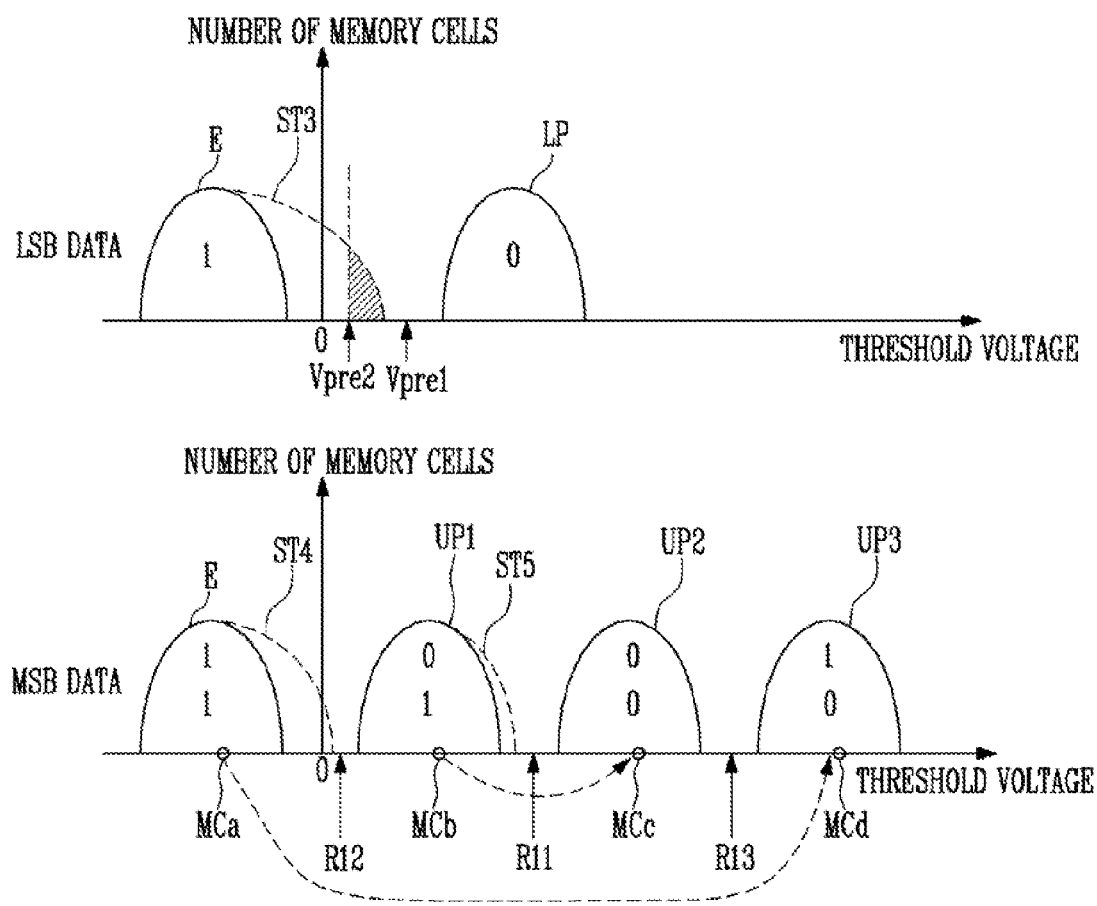
FIG. 7 is a graph describing first and second pre-read voltages.

FIG. 6 is a flowchart showing a method of operating the memory system 10 according to an embodiment of the present invention. FIG. 7 is a graph describing first and second pre-read voltages Vpre1 and Vpre2.

Referring to FIGS. 4 and 6 at step S110, the memory system 10 performs the MSB program on the physical page using the first pre-read voltage Vpre1. The memory controller 100 receives the logical block address LBA and the host data HDATA from the host. The memory controller 100 converts the logical block address LBA into the physical block address PBA and transmits the control signal CTRL, the physical block address PBA, and the memory data MDATA for the MSB program to the semiconductor memory device 200. The peripheral circuit 220 programs the memory data MDATA as the MSB data on the physical page based on the physical block address PBA. The peripheral circuit 220 reads the LSB data stored in the physical page using the first pre-read voltage Vpre1. Referring to FIG. 7, the first pre-read voltage Vpre1 may have an optimized voltage level in which a read margin between an erase state E and a lower program state LP is considered. The memory cells of the erase state E having the threshold voltage lower than the first pre-read voltage Vpre1 are detected to have a first logical value. The memory cells of the lower program state LP having a threshold voltage higher than the first pre-read voltage Vpre1 are detected to have a second logical value. Referring again to FIGS. 4 and 6, the peripheral circuit 220 programs the memory data MDATA on the physical page with reference to the read LSB data According to the MSB program, the memory cells having the first logical value are programmed to have the erase state E and a first upper program state UP1, and the memory cells having the second logical value are programmed to have second and third upper program states UP2 and UP3.

At step S120, the memory system 10 compares the number of the error bits included in the MSB data of the physical page with a first threshold value to determine whether to define an area corresponding to the physical page as the management area. The memory controller 100 transmits the control signal CTRL for reading the MSB data and the physical block address PBA to the semiconductor memory device 200. The peripheral circuit 220 reads the MSB data from the physical page based on the physical block address PBA, and outputs the read MSB data as the memory data MDATA to the memory controller 100. The error correction block 130 of the memory controller 100 detects the error bits included in the memory data MDATA based on the parity bits included in the memory data MDATA. The processing unit 120 designates the area corresponding to the corresponding physical page as the management area when the number of the detected error bits is greater than the first threshold value. When the number of the error bits is greater than the first threshold value, the reliability of the corresponding physical page which is related to the MSB data is determined to be low. When the number of the error bits is less than or equal to the first threshold value, the reliability of the corresponding physical page which is related to the MSB data is determined to be high.

Meanwhile, when the number of the error bits among total bits of the memory data MDATA is greater than a certain proportion of the number of total bits of the memory data MDATA, it is well known that the error correction block 130 may not detect the error bits. As an embodiment, the first threshold value may be less than or equal to the guaranteed number.

Then, an erase operation may be performed on the physical page included in the management area. After the erase operation is performed, the LSB program and the MSB program may be performed on the corresponding physical page.

At step S130, the memory system 10 performs the MSB program on the physical page included in the management area using the second pre-read voltage Vpre2, which is lower than the first pre-read voltage Vpre1. The memory controller 100 receives the logical block address LBA and the host data HDATA from the host. The memory controller 100 converts the logical block address LBA into the physical block address PBA and determines whether the physical page corresponding to the physical block address PBA is included in the management area. If the physical page corresponds to the management area, the memory controller 100 controls the semiconductor memory device 200 to perform the MSB program on the corresponding physical page using the second pre-read voltage Vpre2.

An operation at step S130 will be described below in more detail.

Referring to FIG. 7, after the LSB program is performed, the threshold voltages of the memory cells of the erase state E may be increased and thus the memory cells of the erase state E may have a third voltage state ST3. For example, the threshold voltages of the memory cells of the erase state E may be increased due to an influence of the memory cells having the lower program state LP. As another example, the threshold voltages of the memory cells of the erase state E may be increased due to high voltages applied when a subsequent program operation is performed on the other physical page. The third voltage state ST3 is lower than the first pre-read voltage Vpre1. On the other hand, some (see a shaded part) of the memory cells of the third voltage state ST3 are higher than the second pre-read voltage Vpre2.

When the LSB data are read based on the first pre-read voltage Vpre1, the memory cells of the third voltage state ST3 are read as the first logical value. On the other hand, when the LSB data are read in response to the second pre-read voltage Vpre2, the memory cell having the threshold voltage lower than the second pre-read voltage Vpre2 is read as the first logical value, and the memory cell of the shaded part having the threshold voltage higher than the second pre-read voltage Vpre2 is read as the second logical value, among the memory cells of the third voltage state ST3. That is, the memory cells of the shaded part are read as the second logical value in the same manner as in the memory cells of the lower program state LP. As a result, the LSB data read based on the second pre-read voltage Vpre2 have increased error bits. Some of the memory cells, which are read as the first logical value when the LSB data are read based on the first pre-read voltage Vpre1, are read as the second logical value when the LSB data are read in response to the second pre-read voltage Vpre2. Thus, the number of the memory cells read as the first logical value is reduced.

The MSB program is performed based on the read LSB data. The memory cells of which the LSB data are read as the first logical value are programmed to have the erase state E and the first upper program state UP1, and the memory cells of which the LSB data are read as the second logical value are programmed to have the second and third upper program states UP2 and UP3. Since the number of the memory cells read as the first logical value based on the second pre-read voltage Vpre2 is reduced, the number of the memory cells of the erase state E and the first upper program state UP1 is also reduced. Since the number of the memory cells read as the second logical value based on the second pre-read voltage Vpre2 is increased, the number of the memory cells having the second and third upper program states UP2 and UP3 is increased.

More specifically, among the memory cells read as the first logical value, the memory cells that store the MSB "1" are programmed to have the erase state E, and the memory cells that store the MSB "0" are programmed to have the first upper program state UP1. Among the memory cells read having the second logical value, the memory cells to be store the MSB "1" are programmed to have the third upper program state UP3, and the memory cells to be store the MSB "0" are programmed to have the second upper program state UP2.

When it is assumed that the MSB program is performed on the memory cells of the shaded part using the first pre-read voltage Vpre1, the memory cells of the shaded part are read as the first logical value. Among the memory cells of the shaded part, the memory cells that store the MSB "1" have a threshold voltage MCa of the erase state E, and the memory cells that store the MSB "0" have a threshold voltage MCb of the first upper program state UPS.

When it is assumed that the MSB program is performed on the memory cells of the shaded part using the second pre-read voltage Vpre2, the memory cells of the shaded part are read as the second logical value. Among the memory cells of the shaded part, the memory cells that store the MSB "1" have a threshold voltage MCd of the third upper program state UP3, and the memory cells that store the MSB "0" have a threshold voltage MCc of the second upper program state UP2.

Since the second pre-read voltage Vpre2 is used instead of the first pre-read voltage Vpre1, the memory cells that store the MSB "1," among the memory cells of the shaded part, have the threshold voltage MCd instead of the threshold voltage MCa Therefore, the number of memory cells corresponding to the erase state E is reduced, and the number of the memory cells corresponding to the third upper program state UP3 is increased. The memory cells that store the MSB "0," among the memory cells of the shaded part, have the threshold voltage MCc instead of the threshold voltage MCb. Therefore, the number of memory cells corresponding to the first upper program state UP1 is reduced, and the number of the memory cells corresponding to the second upper program state UP2 is increased. Thus, an error rate of the MSB data is reduced. The reason is as follows.

As described with reference to FIG. 3, after the MSB program is performed, the threshold voltages of the memory cells of the erase state E may be easily increased due to various reasons. After the MSB program is performed, the threshold voltages of the memory cells of the erase state E may be increased and thus the memory cells of the erase state E may have a fourth voltage state ST4. The threshold voltages of the memory cells of the first upper program state UP1 may be increased and thus the memory cells of the first upper program state UP1 may have a fifth voltage state ST5. Since the MSB program is performed by reading the LSB data using the second pre-read voltage Vpre2, the number of the memory cells of the erase state E is reduced after the MSB program performed. Therefore, for example, the number of memory cells, which are selected from the memory cells of the fourth voltage state ST4 and have a threshold voltage that is higher than a second read voltage R12, is reduced in comparison with that, of the first voltage state ST1 of FIG. 3. In FIG. 7, all the memory cells of the fourth voltage state ST4 are shown to have the threshold voltage that is lower than the second read voltage R12. The second read voltage R12 between the erase state E and the first upper program state UP1 is applied when the MSB data are read. Since the number of memory cells that are selected from the memory cells of the fourth voltage state ST4 and have the threshold voltage higher than the second read voltage R12 is reduced, an error rate of the MSB data is reduced. Therefore, when the MSB program is performed using the second pre-read voltage Vpre2, the error rate of the MSB data may be reduced.

Meanwhile, when the MSB program is performed using the second pre-read voltage Vpre2, an error rate of the LSB data may be increased. The error bits included in the LSB data are detected and corrected by the error correction block 130 (see FIG. 4). For example, when it is more important to cope with the error rate of the MSB data rather than the error rate of the LSB data, the MSB program may be performed using the second pre-read voltage Vpre2. As the voltage level of the pre-read voltage is regulated, the error rate of the LSB data and the error rate of the MSB data are in a trade off relationship with each other. The difference between the first pre-read voltage Vpre1 and the second pre-read voltage Vpre2 may be determined based on the error rate of the MSB data and the error rate of the LSB data.

According to an embodiment of the present invention, the MSB program is performed using the second pre-read voltage Vpre2, which is lower than the first pre-read voltage Vpre1. Thus, the error rate of the MSB data is reduced. Therefore, the memory system 10 may improve its reliability.

Figure 8:
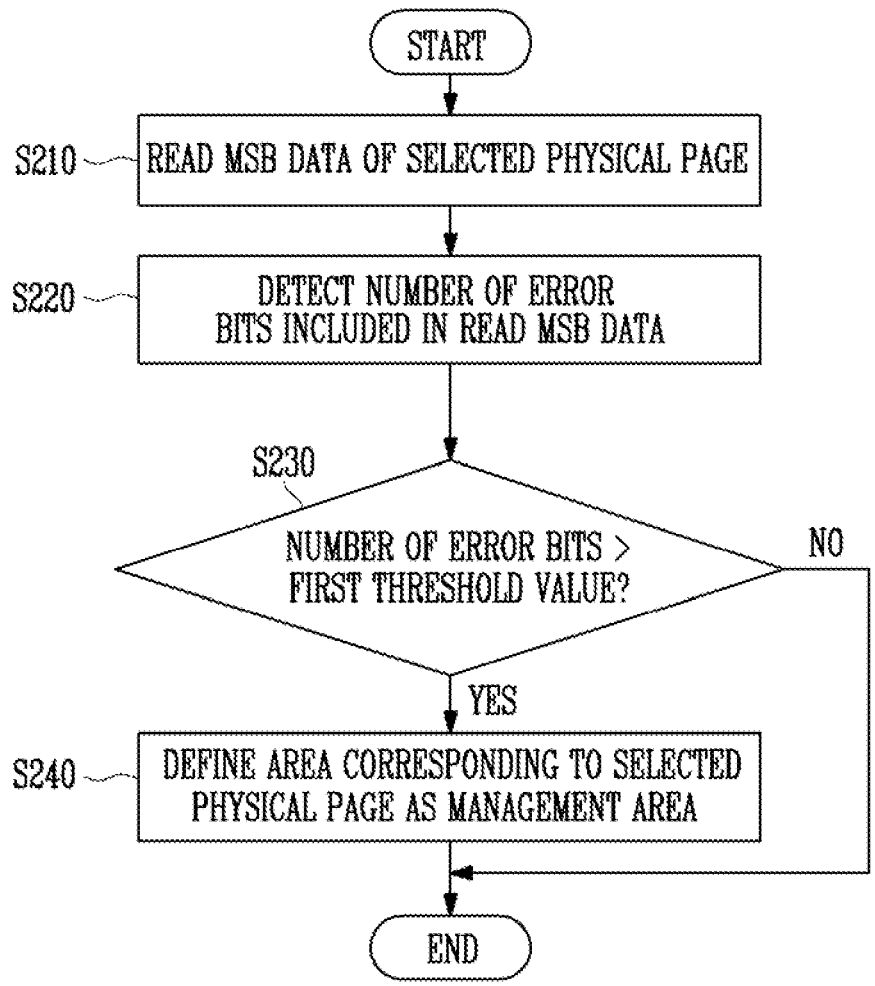
FIG. 8 is a flowchart showing an example of a method of defining a management area by a memory controller.

FIG. 8 is a flowchart showing an example of a method of defining the management area by the memory controller 100.

Referring to FIGS. 4 and 8, at step S210, the memory controller 100 reads the MSB data of the selected physical page. For example, the memory controller 100 reads the MSB data of each physical page of the memory cell array 210 each time at which a predetermined number of program and erase operations are performed. For example, the memory controller 100 reads the MSB data of each physical page from the memory cell array 210 each given time. For example, the memory controller 100 reads the LSB data and the MSB data from each physical page of the memory block selected for garbage collection.

At step S220, the memory controller 100 detects the number of error bits included in the read MSB data. The error correction block 130 determines the number of error bits included in the MSB data based on the parity bit included in the MSB data.

At step S230, the memory controller 100 determines whether the number of the detected error bits is greater than the first threshold value. When the number of the error bits is greater than the first threshold value (YES), the reliability of the corresponding physical page, which is related to the MSB data, is determined to be low. When the number of the error bits is less than or equal to the first threshold value (NO), the reliability of the corresponding physical page which is related to the MSB data is determined to be high. When the number of the error bits is greater than the first threshold value (YES), an operation at step S240 is performed.

At step S240, the memory controller 100 defines an area corresponding to the selected physical page as the management area.

Figure 9:
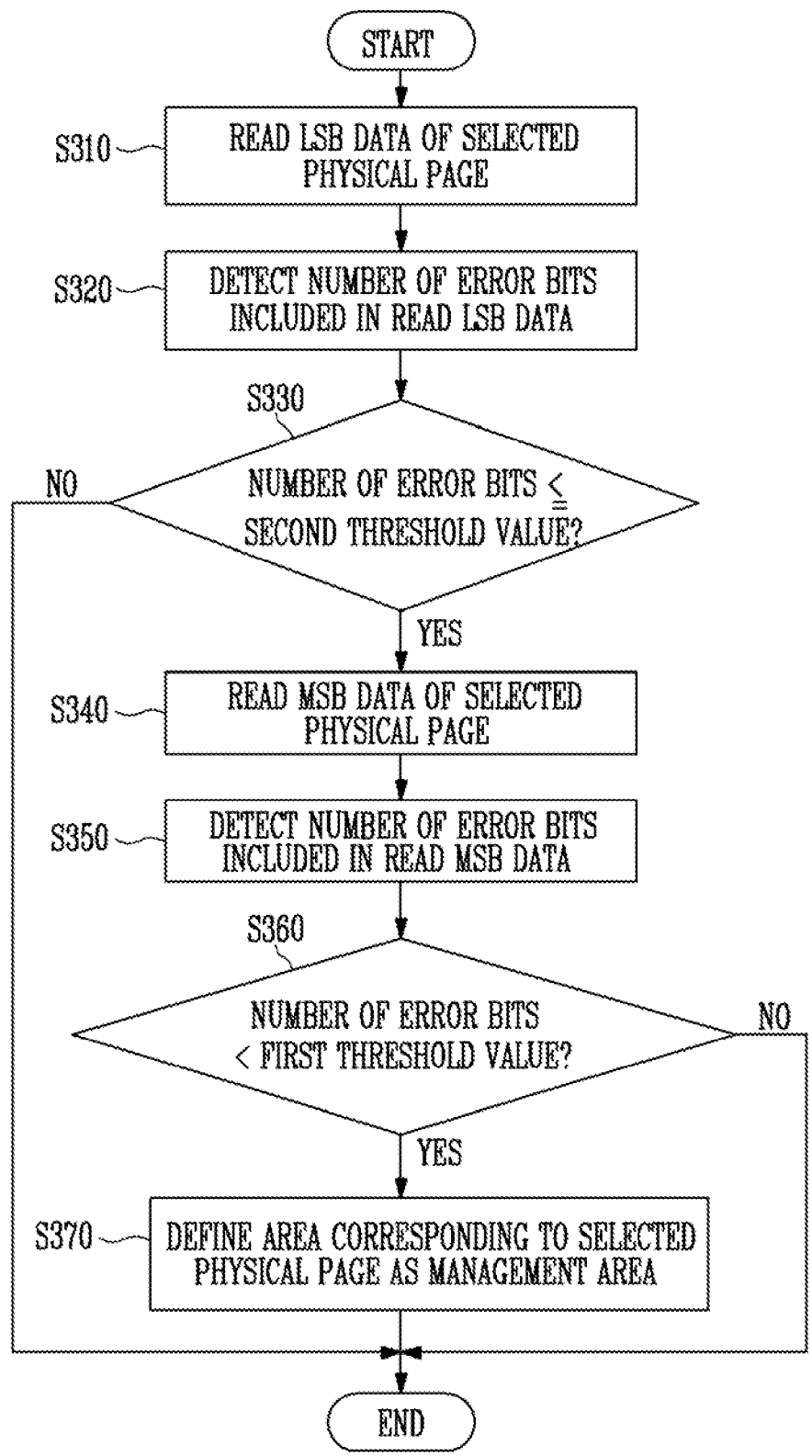
FIG. 9 is a flowchart showing another example of the method of defining the management area by the memory controller.

FIG. 9 is a flowchart showing another example of the method of defining the management area by the memory controller 100.

Referring to FIGS. 4 and 9, at step S310, the memory controller 100 reads the LSB data of the selected physical page. At step S320, the memory controller 100 detects the number of error bits included in the read LSB data. The error correction block 130 determines the number of error bits included in the LSB data based on the parity bit included in the LSB data.

At step S330 the memory controller 100 determines whether the number of error bits included in the LSB data is less than or equal to a second threshold value. When the number of the error bits is less than or equal to the second threshold value (YES), the reliability of the corresponding physical page related to the LSB data is determined to be high. When the number of error bits is greater than the second threshold value (NO), the reliability of the corresponding physical page related to the LSB data is determined to be low. When the number of the error bits of the LSB data is less than or equal to the second threshold value (YES), an operation at step S340 is performed.

As an embodiment, the second threshold value may be less than or equal to the maximum number of error bits which may be detected and corrected by the error correction block 130. The second threshold value may be less than the first threshold value.

At step S340, the memory controller 100 reads the MSB data of the selected physical page. As an embodiment, operations at steps S310 and S340 may be sequentially performed. The LSB data and the MSB data of the selected physical page are sequentially read and then operations at steps S320, S330, and S350 to S370 may be performed.

At step S350, the memory controller 100 detects the number of the error bits included in the read MSB data. At step S360, the memory controller 100 determines whether the number of error bits included in the MSB data is greater than the first threshold value. At step S370, the memory controller 100 defines an area corresponding to the selected physical page as the management area when the number of error bits included in the MSB data is greater than the first threshold value (YES).

According to an embodiment of the present invention, when the LSB data of the selected physical page is less than or equal to the second threshold value, and the MSB data of the selected physical page are greater than the first threshold value, the area corresponding to the selected physical page is defined as the management area. That is, when the management area is defined, it may be considered whether the reliability of the selected physical page related to the LSB data is high, as well as whether the reliability of the selected physical page related to the LSB data is low.

Figure 10:
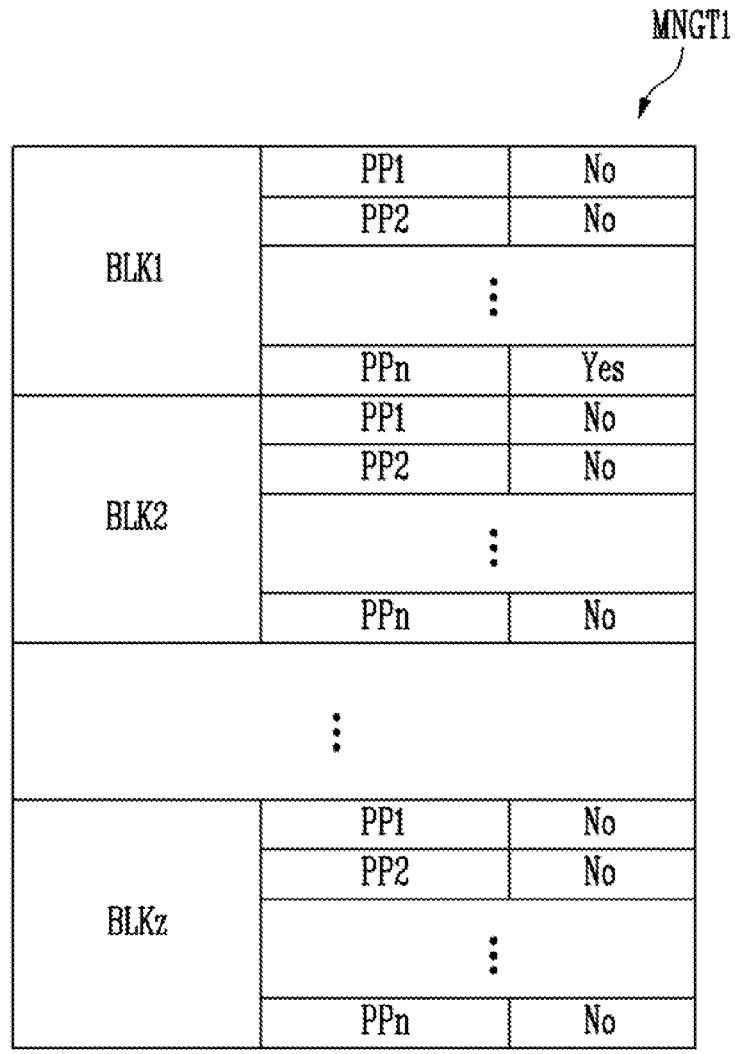
FIG. 10 is a view showing an example of a management area table of FIG. 4.

FIG. 10 is a view showing an example MNGT1 of the management area table MNGT of FIG. 4.

Referring to FIG. 10, the management area is defined in units of physical pages. The management area is defined in the management area table MNGT1 related to physical pages PP1 to PPn included in each of first to $z^{th}$ memory blocks BLK1 to BLKz. In FIG. 10, the $n^{th}$ physical page PPn of the first memory block BLK1 is defined as the management area. The other physical pages may be defined as non-management areas.

It is assumed that the selected physical page of FIG. 9 is the $n^{th}$ physical page PPn of the first memory block BLK1, the LSB data of the selected physical page are less than or equal to the second threshold value, and the MSB data of the selected physical page are greater than the first threshold value. In this case, the $n^{th}$ physical page PPn of the first memory block BLK1 is defined as the management area.

Figure 11:
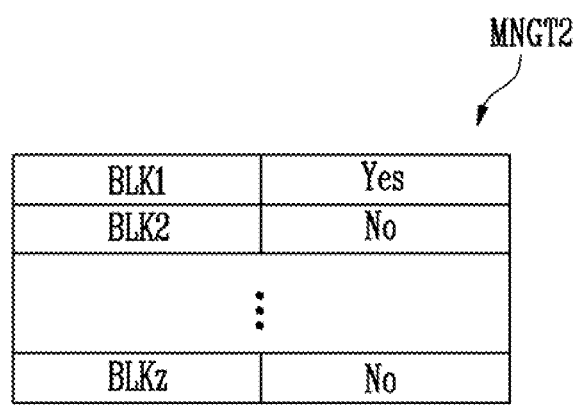
FIG. 11 is a view showing another example of the management area table of FIG. 4.

FIG. 11 is a view showing another example MNGT2 of the management area table MNGT of FIG. 4

Referring to FIG. 11, the management area is defined in units of memory blocks. The management area is defined in the management area table MNGT2 related to each of the first to $z^{th}$ memory blocks BLK1 to BLKz. In FIG. 11, the first memory block BLK1 is defined as the management area.

It is assumed that the selected physical page of FIG. 9 is the $n^{th}$ physical page PPn of the first memory block BLK1, the LSB data of the selected physical page are less than or equal to the second threshold value, and the MSB data of the selected physical page are greater than the first threshold value. In this example, the memory block BLK1 including the selected physical page may be defined as the management area. This results from the high possibility that the other physical pages of the memory block including the selected physical page may also have similar characteristics. As the management area related to the first to $z^{th}$ memory blocks BLK1 to BLKz is defined, a space for the management area table MNGT2 included in the RAM 110 may be reduced.

Figure 12:
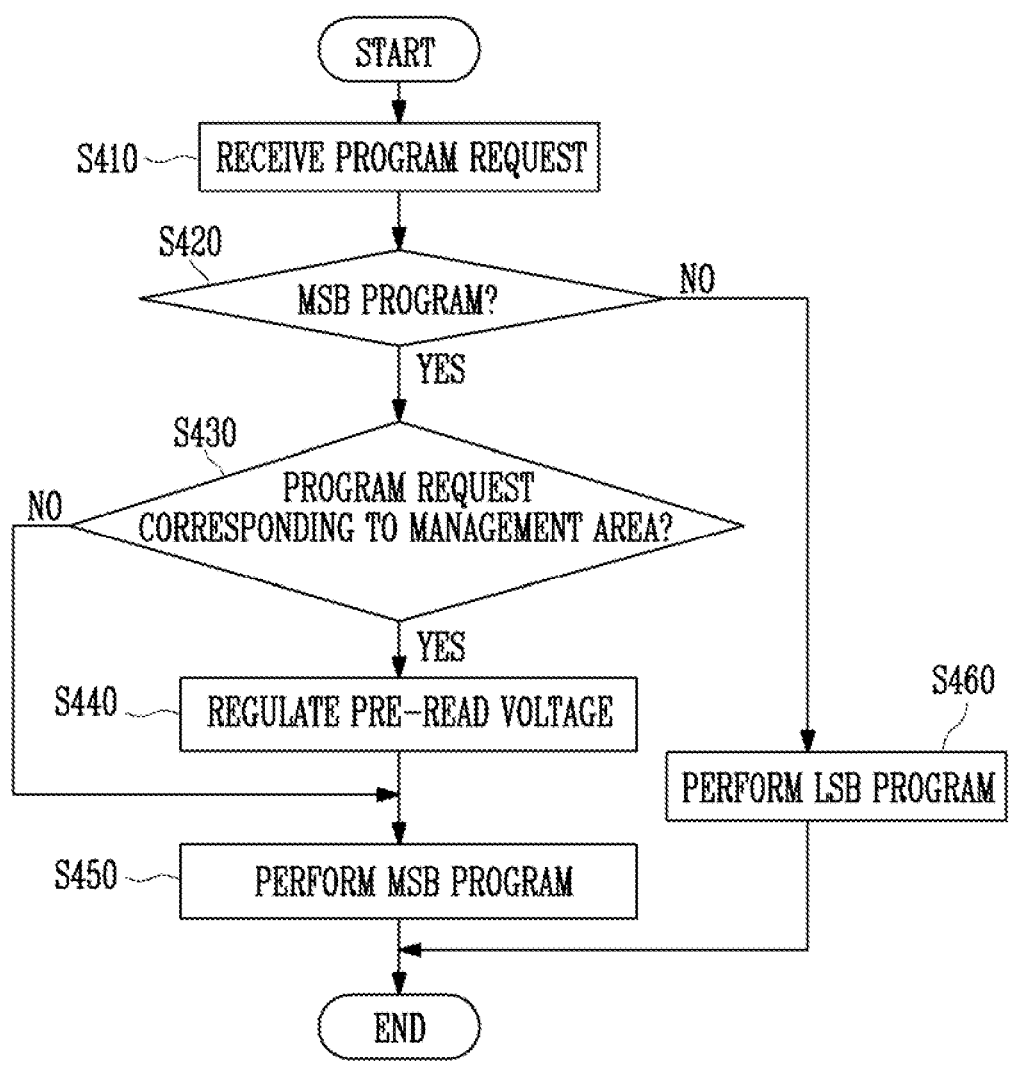
FIG. 12 is a flowchart showing a method of programming a memory controller according to an embodiment of the present invention.

FIG. 12 is a flowchart showing a method of programming the memory controller 100 according to an embodiment of the present invention.

Referring to FIGS. 4 and 12, at step S410, the memory controller 100 receives a program request from the host. The memory controller 100 receives the logical block address LBA and the host data HDATA from the host.

At step S420, the memory controller 100 determines whether the program request corresponds to the MSB program. The memory controller 100 converts the received logical block address LBA into the physical block address PBA which indicates one physical page in the memory cell array 210. The physical block address PBA indicates the LSB data or the MSB data of the corresponding physical page.

The memory controller 100 determines whether the physical block address PBA indicates the MSB data of the selected physical page. If the physical block address PBA indicates the MSB data of the selected physical page (YES), an operation at step S430 is performed. Otherwise (NO), the LSB program is performed at step S460.

At step S430, the memory controller 100 determines whether the program request corresponds to the management area. The memory controller 100 determines whether the selected physical page, based on the program request, corresponds to the management area. In FIG. 10, the management area is defined as the $n^{th}$ physical page PPn of the first memory block BLK1. When the selected physical page is the $n^{th}$ physical page PPn of the first memory block BLK1, the program request corresponds to the management area. When the selected physical page is the other physical pages, the program request does not correspond to the management area. In FIG. 11, the management area is defined as the first memory block BLK1. When the selected physical page is included in the first memory block BLK1, the program request corresponds to the management area. When the selected physical page is included in the other memory blocks, the program request does not correspond to the management area.

When the program request corresponds to the management area (YES), an operation at step S440 is performed. When the program request does not correspond to the management area (NO), an operation at step S450 is performed.

At step S440, the memory controller 100 regulates the pre-read voltage. The memory controller 100 controls the semiconductor memory device 200 so that the voltage generator 222 generates the reduced pre-read voltage.

As an embodiment, the memory controller 100 transmits the voltage level information to the semiconductor memory device 200 to regulate the pre-read voltage. Based on the voltage level information, the semiconductor memory device 200 may reset the voltage level of the pre-read voltage that is generated when the corresponding program operation is performed.

As an embodiment, a voltage level of the pre-read voltage Vpre1 (see FIG. 7) before the pre-read voltage is regulated may be set to a default value. The regulated pre-read voltage Vpre2 (see FIG. 7) may be lower than the default value by a predetermined level.

At step S450, the memory controller 100 performs the MSB program. The memory controller 100 transmits the control signal CTRL, the physical block address PBA, and the memory data MDATA for the MSB program to the semiconductor memory device 200. The peripheral circuit 220 performs the MSB program using the second pre-read voltage Vpre2.

FIG. 13 is a block diagram showing a memory system 1000 according to another embodiment of the present invention.

Referring to FIG. 13, the memory system 1000 includes a memory controller 1100 and a plurality of semiconductor or memory devices 1210 to 12k0.

The memory controller 1100 includes a RAM 110, processing unit 1120, an error correction block 1130, a host interface 1140, and a memory interface 1150.

The memory interface 1150 communicates with the first to $k^{th}$ semiconductor memory devices 1210 to 12k0 through first to $k^{th}$ channels CH1 to CHk, respectively. The first to $k^{th}$ semiconductor memory devices 1210 to 12k0 each operate in the same manner as in the semiconductor memory device 200 described with reference to FIG. 4.

The RAM 1110, the processing unit 1120, the error correction block 1130, the host interface 1140, and the memory interface 1150 are configured to control each semiconductor memory device in the same manner as in the RAM 110, the processing unit 120, the error correction block 130, the host interface 140, and the memory interface 150 described with reference to FIG. 4.

FIG. 14 is a view showing an example MNGT3 of a management area table stored in the RAM 1110.

Referring to FIG. 14, the management area may be defined in units of semiconductor memory devices. The management area is defined in the management area table MNGT3 related to each of the first to $k^{th}$ semiconductor memory devices 1210 to 12k0. In FIG. 14, the first semiconductor memory device 1210 is defined as the management area.

It is assumed that the selected physical page of FIG. 9 is included in the first semiconductor memory device 1210, the LSB data of the selected physical page are less than or equal to the second threshold value, and the MSB data of the selected physical page are greater than the first threshold value. In this case, the first semiconductor memory device 1210 including the selected physical page may be defined as the management area. Since the same process is performed on the memory cell array including the selected physical page at a wafer level, it results from a high possibility that the other physical pages included in the corresponding memory cell array may also have similar characteristics. As the management area related to the first to $k^{th}$ semiconductor memory devices 1210 to 12k0 is defined, a space for the management area table MNGT3 included in the RAM 1110 may be reduced.

Figure 15:
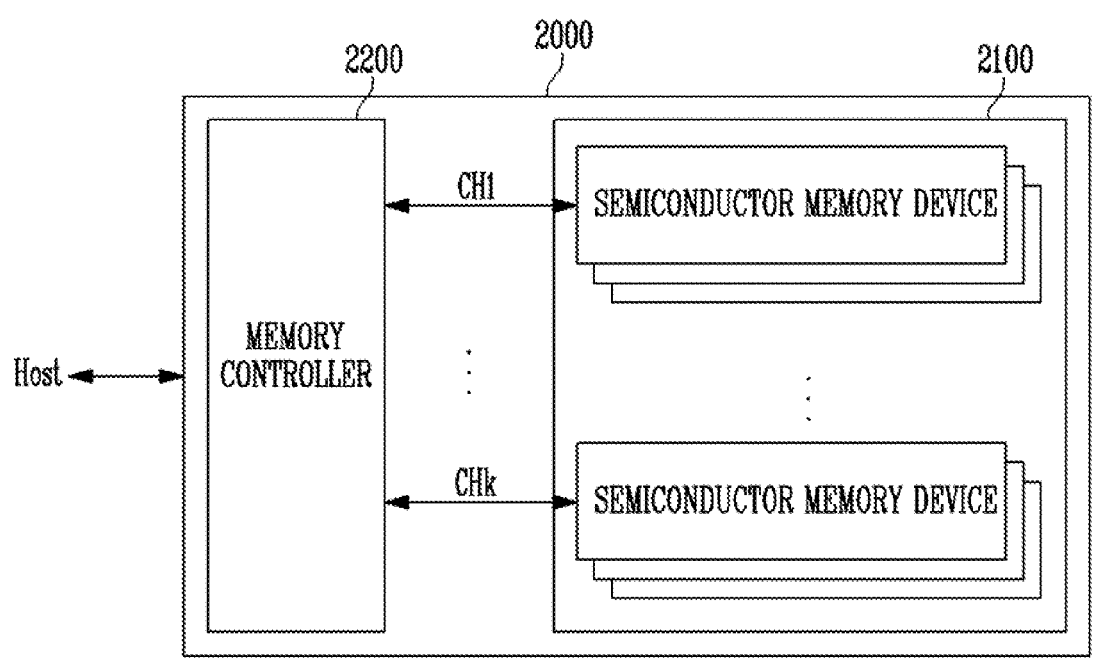
FIG. 15 is a block diagram showing an example of the memory system of FIG. 13.

FIG. 15 is a block diagram showing an application example 2000 of the memory system 1000 shown in FIG. 13.

Referring to FIG. 15 the memory system 2000 includes a semiconductor memory module 2100 and a memory controller 2200. The semiconductor memory module 2100 includes a plurality of semiconductor memory devices. The plurality of semiconductor memory devices are divided into a plurality of groups.

In FIG. 15, it is shown that the plurality of groups in the semiconductor memory devices communicate with the memory controller 2200 through first to $k^{th}$ channels CH1 to CHk, respectively. Each semiconductor memory device is configured and operates in the same manner as in the semiconductor memory device 200 described with reference to FIG. 4.

Each group in the semiconductor memory devices configured to communicate with the memory controller 2200 through one common channel. The memory controller 2200 is configured in the same manner as the controller 1100 described with reference to FIG. 13 and is configured to control the plurality of semiconductor memory devices of the semiconductor memory module 2100 through the plurality of channels CH1 to CHk.

Figure 16:
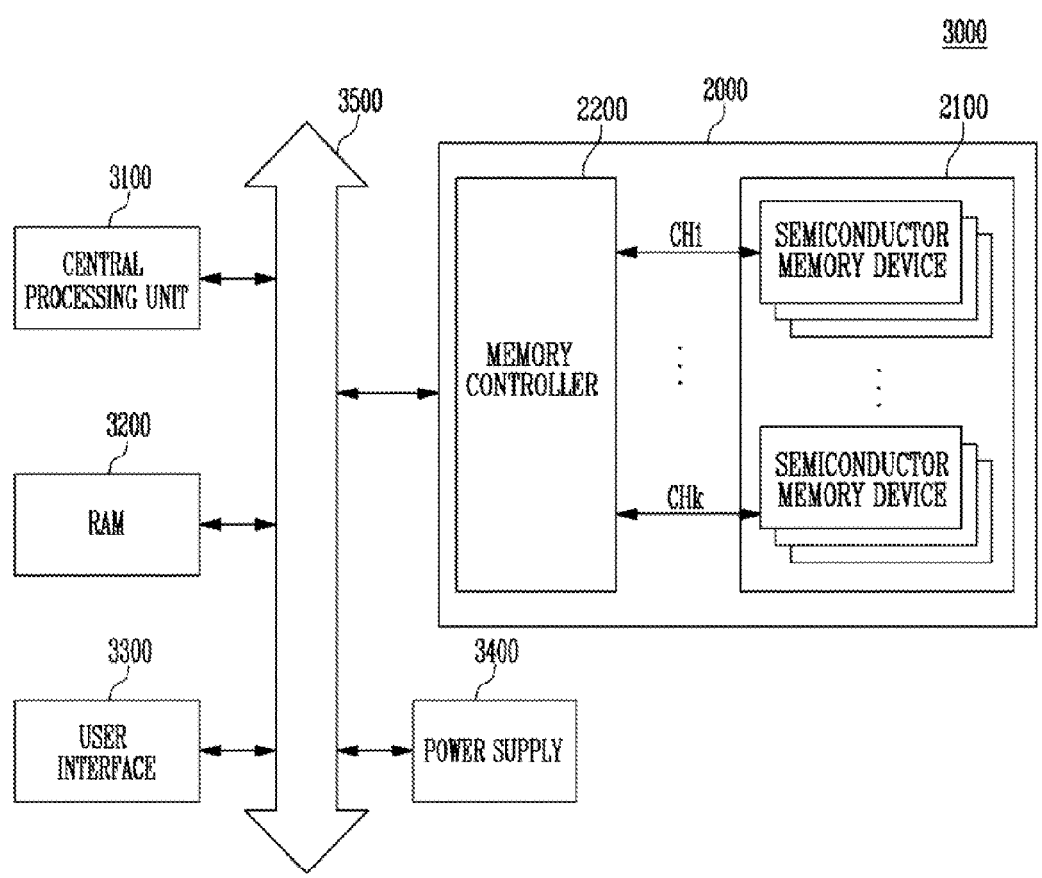
FIG. 16 is a block diagram showing a computing system including the memory system described with reference to FIG. 15.

FIG. 16 is a block diagram showing a computing system 3000 including the memory system 2000 described with reference to FIG. 15.

Referring to FIG. 16, the computing system 3000 includes a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data, which is provided through the user interface 3300 or processed by the central processing unit 3100, is stored in the memory system 2000.

In FIG. 16, the semiconductor memory module 2100 is connected to the system bus 3500 through the memory controller 2200. However, the semiconductor memory device 2100 may be configured to directly connect to the system bus 3500. Here, the central processing unit 3100 and the RAM 3200 may perform functions of the memory controller 2200.

In FIG. 16, it is shown that the memory system 2000 described with reference to FIG. 15 is provided. However, the memory system 2000 may be replaced by the memory system 10 or 1000 described with reference to FIG. 4 or 1.

According to an embodiment of the present invention, the reduced pre-read voltage is used when the MSB program is performed on the physical page of the management area. Thus, an error rate of the MSB data of the physical page in the management area is reduced. Therefore, the reliability of the memory system may be improved.

According to the embodiments of the present invention, a memory system having improved reliability, and a method of operating the same are provided.

In the drawings and specification, exemplary embodiments of the invention have been disclosed, and although specific terms are employed, they are used in a generic and descriptive sense only and not for the purpose of limitation. As for the scope of the invention, it is set forth in the following claims. Therefore, it will be understood by those of ordinary skill in the art that various changes in form and detail may be made without departing from the spirit and scope of the present invention as defined by the following claims.

What is claimed is:

1. A method of operating a memory system having a plurality of physical pages, the method comprising:
reading least significant bit (LSB) data of a first physical page based on a first pre-read voltage and performing a most significant bit (MSB) program based on the LSB data of the first physical page when the MSB program is performed on the first physical page;
defining an area corresponding to the first physical page as a management area by comparing the number of error bits included in MSB data of the first physical page with a first threshold value;
preforming an LSB program on a second physical page of the management area; and
reading LSB data of the second physical page based on a second pre-read voltage, which is lower than the first pre-read voltage, and performing the MSB program on the second physical page based on the LSB data of the second physical page.

2. The method of claim 1, wherein the area corresponding to the first physical page is defined as the management area when the number of the error bits included in the MSB data of the first physical page is greater than the first threshold value.

3. The method of claim 2, wherein the defining of the area corresponding to the first physical page as the management area comprises:
reading the MSB data of the first physical page;
detecting the number of the error bits included in the MSB data of the first physical page; and
defining the area corresponding to the first physical page as the management area when the number of the error bits included in the MSB data of the first physical page is greater than the first threshold value.

4. The method of claim 1, wherein the area corresponding to the first physical page is defined as the management area when the number of the error bits included in the MSB data of the first physical page is greater than the first threshold value and the number of error bits included in the LSB data of the first physical page is less than or equal to a second threshold value.

5. The method of claim 4, wherein the defining of the area corresponding to the first physical' page as the management area comprises:
reading the LSB data of the first physical page;
detecting the number of the error bits included in the LSB data of the first physical page;
reading the MSB data of the first physical page;
detecting the number of the error bits included in the MSB data of the first physical page; and
defining the area corresponding to the first physical page as the management area when the number of the error bits included in the MSB data of the first physical page is greater than the first threshold value and the number of the error bits included in the LSB data of the first physical page is less than or equal to the second threshold value.

6. The method of claim 1, wherein the first physical page is defined as the management area when the number of the error bits included in the MSB data of the first physical page is greater than the first threshold value.

7. The method of claim 1, wherein a memory block including the first physical page is defined as the management area when the number of the error bits included in the MSB data of the first physical page greater than the first threshold value.

8. The method of claim 1, wherein a semiconductor memory device including the first physical page is defined as the management area when the number of the error bits included in the MSB data of the first physical page is greater than the first threshold value.

9. The method of claim 1, wherein the first physical page is the same as the second physical page.

10. The method of claim 1, wherein the first physical page is different from the second physical page.

11. The method of claim 1, further comprising:
performing the LSB program on the first physical page before the performing of the MSB program based on the LSB data of the first physical page.

12. The method of claim wherein the reading of the LSB data of the second physical page comprises:
setting a voltage generator included in the memory system generate the second pre-read voltage; and
reading the LSB data of the second physical page in response to the second pre-read voltage provided by the voltage generator.

13. The method of claim 1, wherein the defining of the area corresponding to the first physical page as the management area performed each given time.

14. The method of claim 1, wherein the defining of the area corresponding to the first physical page as the management area is performed when a predetermined number of program and erase operations are performed.

15. A memory system comprising:
- a semiconductor memory device having a plurality of physical pages, suitable for reading LSB data of each physical page based on a first pre-read voltage and performing an MSB program based on the LSB data when the MSB program is performed on each of the plurality of physical pages; and
- a memory controller suitable for comparing the number of error bits included in MSB data of each physical page with a first threshold value to define an area of a corresponding physical page as a management area according to a result of the comparing,
- wherein the memory controller controls the semiconductor memory device to read LSB data of a physical page included in the management area based on a second pre-read voltage that is lower than the first pre-read voltage when the MSB program is performed on the physical page included in the management area.

16. The memory system of claim 15, wherein, under the control of the memory controller, the semiconductor memory device reads the LSB data of the physical page included in the management area based on the second pre-read voltage and performs the MSB program on the physical page included in the management area based on the LSB read data.

17. The memory system of claim 15, wherein the semiconductor memory device further comprises a voltage generator suitable for generating a plurality of voltages,
- wherein the voltage generator outputs the first pre-read voltage among the plurality of voltages, and outputs the second pre-read voltage among the plurality of voltages under the control of the memory controller when the MSB program is performed on the physical page included in the management area.

18. The memory system of claim 15, wherein, when a physical page which stores the MSB data having the number of the error bits greater than the first threshold value is detected, the memory controller defines an area corresponding to the detected physical page as the management area.

19. The memory system of claim 15, wherein, when a physical page, which stores the MSB data having the number of the error bits greater than the first threshold value and the LSB data having the number of error bits less than or equal to the second threshold value, is detected, the memory controller defines an area corresponding to the detected physical page as the management area.

20. The memory system of claim 15, wherein the memory controller stores a table representing the management area therein.

* * * * *